(12) United States Patent  (10) Patent No.: US 7,632,350 B2
Wiseman  (45) Date of Patent: Dec. 15, 2009

(54) CRYSTAL GROWER WITH INTEGRATED LITZ COIL

(75) Inventor: Donald H. Wiseman, Waukesha, WI (US)

(73) Assignee: ABP Induction, LLC, North Brunswick, NJ (US)

( * ) Notice: Subject to any disclaimer, the term of this patent is extended or adjusted under 35 U.S.C. 154(b) by 1449 days.

(21) Appl. No.: 10/707,909

(22) Filed: Jan. 23, 2004

(65) Prior Publication Data

US 2005/0160973 A1 Jul. 28, 2005

(51) Int. Cl.
*C30B 15/02* (2006.01)

(52) U.S. Cl. .......................... 117/34; 117/13; 117/208; 117/217

(58) Field of Classification Search .................. 117/13, 117/34, 208, 217
See application file for complete search history.

(56) References Cited

U.S. PATENT DOCUMENTS

| | | | |
|---|---|---|---|
| 3,857,679 A | 12/1974 | Allred | |
| 4,249,988 A | 2/1981 | Lavigna et al. | |
| 4,321,690 A * | 3/1982 | Imura | 365/2 |
| 5,461,215 A * | 10/1995 | Haldeman | 219/677 |
| 5,660,754 A * | 8/1997 | Haldeman | 219/662 |
| 5,679,151 A | 10/1997 | Ohmoto et al. | |
| 6,117,230 A * | 9/2000 | Ammon et al. | 117/13 |
| 6,229,126 B1 | 5/2001 | Ulrich et al. | |
| 6,285,011 B1 * | 9/2001 | Cherko | 219/426 |
| 6,346,690 B1 | 2/2002 | Ulrich et al. | |
| 6,355,910 B1 * | 3/2002 | Seidl et al. | 219/426 |
| 6,402,840 B1 | 6/2002 | Pandelisev | |

* cited by examiner

Primary Examiner—Robert M Kunemund
(74) Attorney, Agent, or Firm—Ziolkowski Patent Solutions Group, SC

(57) ABSTRACT

An apparatus and method of manufacturing a crystal grower is disclosed. The crystal grower includes a reservoir constructed to receive a crystal growing material therein. An induction heater having a coil of woven strands of wire is disposed proximate the reservoir and heats the crystal growing material.

28 Claims, 4 Drawing Sheets

CRYSTAL GROWER WITH INTEGRATED LITZ COIL

BACKGROUND OF INVENTION

The present invention relates generally to crystal growers, and more particularly, to a crystal grower having an integrated Litz coil induction heater.

The process of crystal growing has applications to many industries including the electronics industry. Many semiconductors are formed by the crystal growing process.

The process of crystal growing requires heating a base material to a molten state thereby forming a molten pool of crystalline base material. A seed is then placed in contact with the molten pool of material and withdrawn therefrom. As the seed is withdrawn from the molten material pool, a portion of the molten material is withdrawn from the pool in the form of a ribbon thereby growing the crystal.

In order to grow the crystal from the pool of molten material, the pool of molten material must be maintained at a precise temperature depending partly upon the material properties of the base material. Pool temperatures that are below a desired temperature can result in excessive crystal sizes or can result in non-homogenous mixing of the constituent components of the molten material. Temperatures that are above a desired temperature can result in a crystalline structure that is unstable. This instability results in reduced lengths of crystal that can be grown at the increased temperatures. The viscosity of the molten material at increased temperatures cannot support the tension of a crystal being withdrawn from the pool. Therefore, in order to facilitate a desired rate of crystal growth and a desired crystal quality, the pool of molten crystalline base material must be precisely maintained. Induction heaters offer an accurate and easy to control heat source and are commonly used to maintain a desired pool temperature.

Known induction heaters generally consist of a coil of conductive tubing. As a high frequency alternating current is passed through the conductive tubing, a magnetic flux is generated. The coil is positioned generally adjacent an object to be heated and the magnetic flux of the coil induces a current in the material to be heated. Due to the internal resistance of the material to be heated, inducing a current in the material results in the heating of the material. In the case of crystal growing, the induction heater induces enough current to melt the material positioned in a reservoir adjacent the induction heater. Alternatively, the reservoir can be constructed of a material that is responsive to induction heating such that heating of the reservoir results in indirect induction heating of the material. Regardless of which heating strategy is applied, a thermal isolator is generally positioned between the heating target and the induction heater to minimize radiation thermal exchange between the induction coil and the heating target.

Known crystal growers are generally electrically inefficient devices. Due in part to the thermal isolator, a distance is maintained between the heating target and the induction coil. In order to achieve the desired induction current, and therefore temperature, in the target, increased currents must be applied to the induction heater coil. The electrical resistance of the induction heater coil contributes to the total power loss of coil. As the electrical current demand on the induction coil heater increases, the overall efficiency of the induction heater coil decreases. A significant amount of the total energy applied to the induction heater is not used to induce current, and thereby generate heat, in the crystalline material. Therefore, it takes a considerable amount of energy to heat the crystalline base material to a molten state.

In order to induce a sufficient current in the material or the reservoir, the induction heater is subject to a high frequency alternating current. The electrical efficiency of the induction heater is partly determined by the electrical resistance of the induction heater coil to the high frequency alternating current. The distance between the induction heater and the target and the electrical resistance of the induction heater coil contribute to decreases in the overall efficiency of the crystal grower. A user of such a crystal grower must expend considerable resources for all of the energy consumed by the induction heater including that portion of the energy that is not utilized for inducing current in the crystalline base material.

It would therefore be desirable to have a crystal grower capable of heating a crystalline material with appreciable efficiency over known crystal growers. Since the cost of growing crystals is disproportionately weighted toward energy use, such a system would have significant advantages to not only each user, but also to the general environment and economy.

BRIEF DESCRIPTION OF INVENTION

The present invention provides a crystal growing apparatus, a method of manufacturing a crystal grower, and a method of growing a crystal that solves the aforementioned problems. A crystal grower includes a reservoir constructed to receive a crystal growing material therein. An induction heater having a coil of woven stranded wire is positioned about the crystal growing material and induces heat therein thereby melting the crystal growing material. An example of such wire is a Litz coil. A crystal grower having an induction heater incorporating Litz characteristics realizes a considerable increase in electrical efficiency over known crystal growing devices.

Therefore, in accordance with one aspect of the present invention, a crystal growing apparatus is disclosed having a receptacle and an induction heater. The receptacle is constructed to receive a material selected to grow a crystal. The induction heater incorporates a Litz coil and is constructed to heat the material. Such a construction forms a crystal growing apparatus that is substantially more electrically efficient than known crystal growers.

According to another aspect of the present invention, an induction heater is disclosed having a casing having a first end and a second end. The casing has a coil of woven strands of wire having a first end and a second end passing therethrough. A lead is connected to an end of the coil of woven strands of wire and has a passage therethrough. The passage through the lead is constructed to provide coolant to a space between the coil of woven strands of wire and the casing.

In accordance with a further aspect of the present invention, a method of manufacturing a crystal grower is disclosed. The method includes the steps of providing a reservoir to receive a crystal growing material therein and coiling a Litz coil about the reservoir.

In accordance with yet another aspect of the present invention, a method of growing a crystal is disclosed which includes the steps of placing a crystal growing material in a vessel and energizing a coil of wire wound about the vessel is constructed to have Litz characteristics such that a significant increase in heating efficiency is achieved.

Various other features, objects and advantages of the present invention will be made apparent from the following detailed description and the drawings.

BRIEF DESCRIPTION OF DRAWINGS

The drawings illustrate one preferred embodiment presently contemplated for carrying out the invention.

In the drawings.

DETAILED DESCRIPTION

Figure 1:
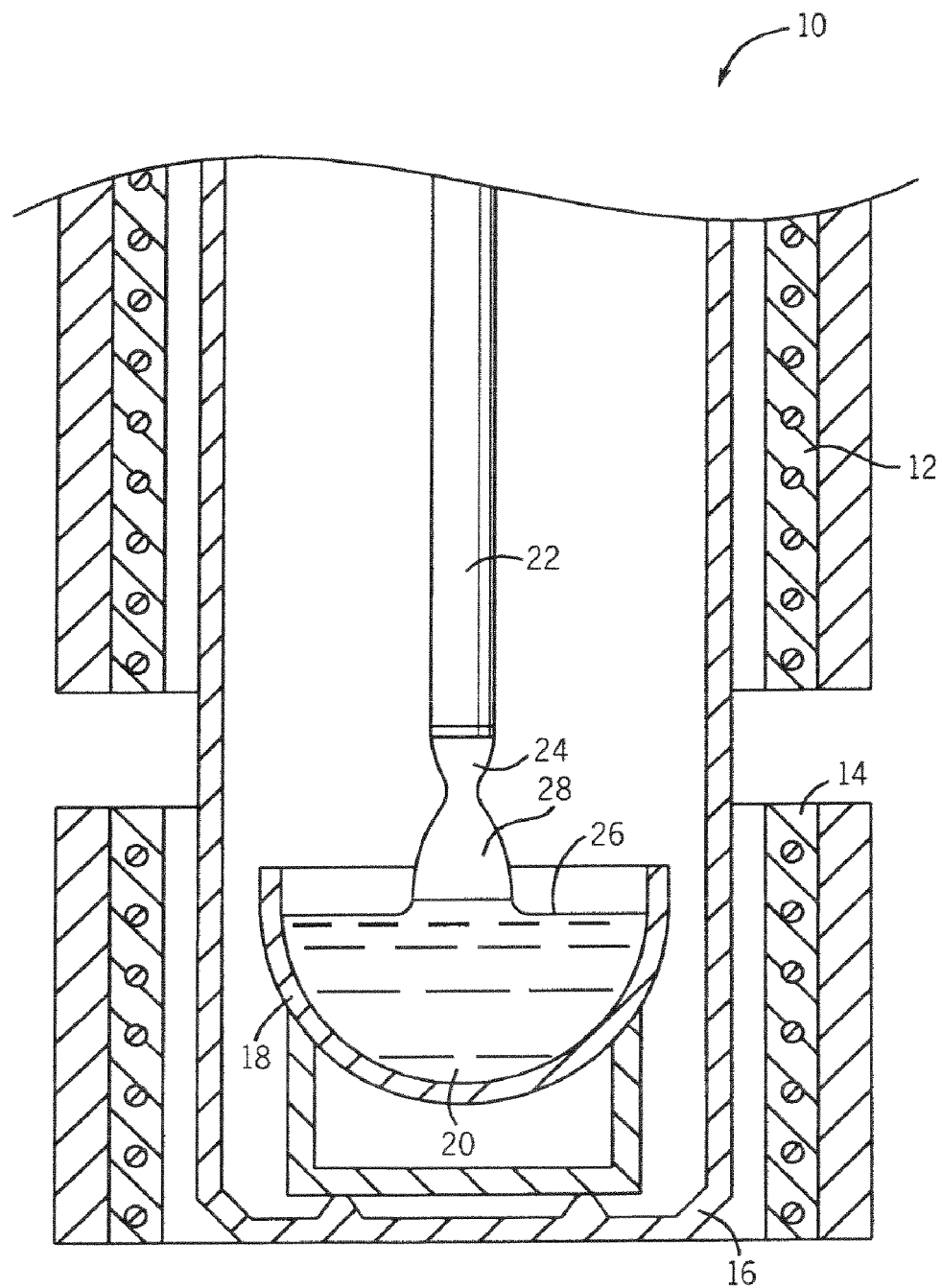
FIG. 1 is a crystal grower according to the present invention.

The present invention relates to crystal growers, and preferably, those incorporating induction type heating coils. FIG. 1 shows a crystal grower 10 having two such heaters 12 and 14. Induction heaters 12, 14 are positioned about enclosure 16. Enclosure 16 reduces atmospheric contamination of a crystal grown therein. Additionally, enclosure 16 may be filled with an inert gas to further support desired crystalline quality. Within enclosure 16, a vessel, crucible, or reservoir 18, is constructed to contain a crystalline base material 20 therein. Heater 14, when energized, induces current in crystalline base material 20 thereby melting the base material to a molten state. Alternatively, reservoir 18 could be constructed of a material that is responsive to induction heating such that, rather than induction heating of base material 20 directly, induction heater 14 may heat reservoir 18, thereby indirectly heating base material 20 positioned in the reservoir. Optionally, an insulator (not shown) can be positioned between reservoir 18 and induction heater 14. Due to a temperature differential that may exist between reservoir 18 and induction heater 14 during operation, the insulator reduces inadvertent cooling of reservoir 18 by induction heater 14.

Once in a generally homogenous molten state, a puller 22 introduces a seed, or tip 24, into contact with an upper surface 26 of base material 20. Puller 22 is then withdrawn from crystalline base material 20 forming a crystal 28 therebetween. The process of withdrawing crystal 28 from crystalline base material 20 is commonly known as growing, or pulling, a crystal. Optional induction heater 12 maintains a temperature of the crystal 28 as it is drawn from crystalline base material 20 by puller 22. Although induction heaters 12 and 14 are shown outside of enclosure 16, it is equally understood that heaters 12 and 14 could be positioned within enclosure 16.

Figure 2:
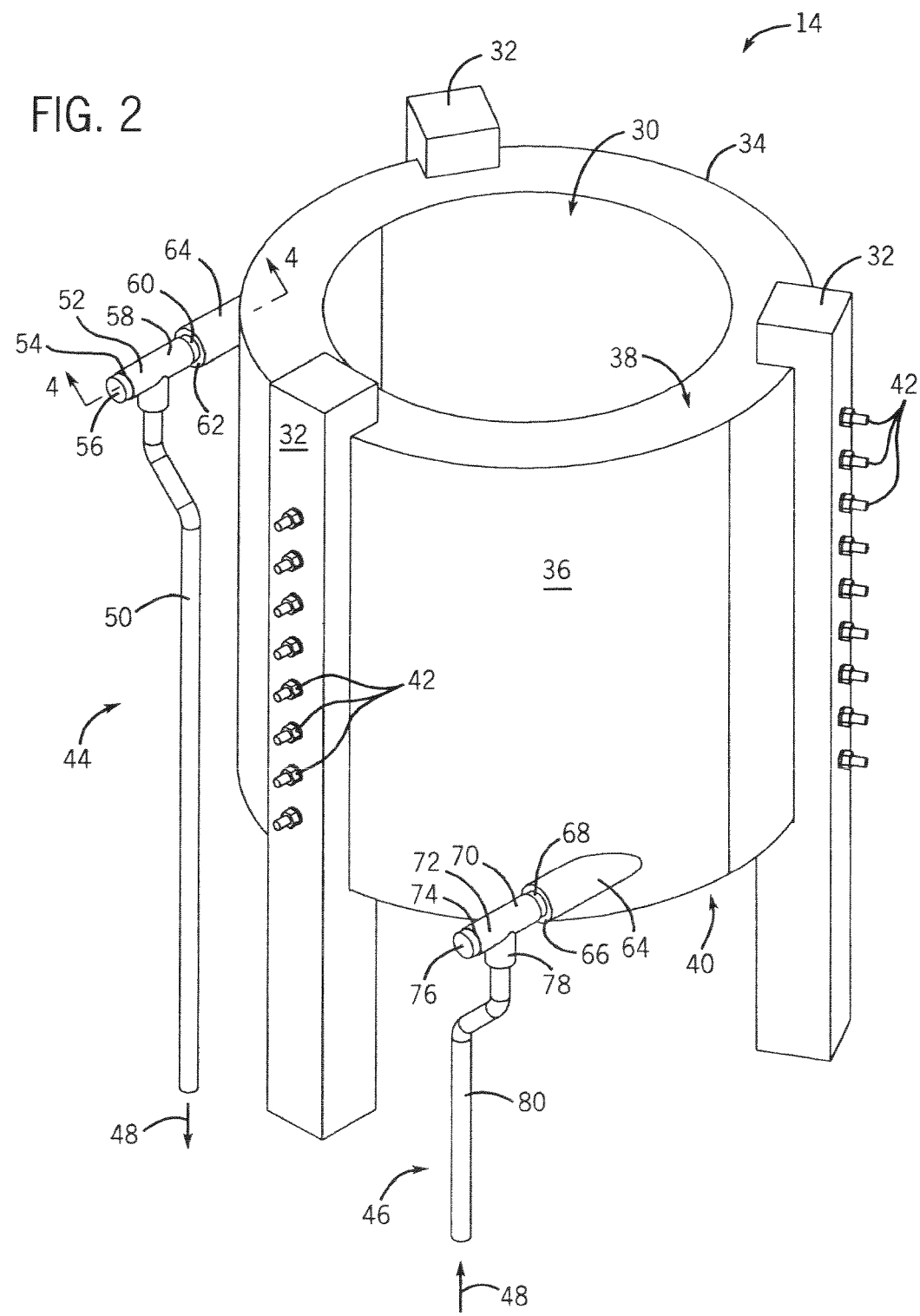
FIG. 2 is a perspective view of the induction heater shown in FIG. 1.

Referring to FIG. 2, induction heater 14 has an opening 30 formed therein. Opening 30 is constructed to allow placement of reservoir 18 and enclosure 16 therein, as shown in FIG. 1. A plurality of legs 32 are positioned about a perimeter 34 of a housing, or body 36, of induction heater 14. Each leg 32 extends from a first end 38 of body 36 and past a second end 40 of body 36. A plurality of cable ties 42 pass through legs 32 and engage a coil disposed in body 36 as will be described further below with respect to FIG. 5. A first connector 44 and a second connector 46 electrically connect induction heater 14 to a power source (not shown). It is understood that the power source may be designed to supply power at a high frequency, preferably above 3,000 Hz. Additionally, first connector 44 and second connector 46 are hollow and allow a cooling path, indicated by arrow 48, to circulate a cooling flow through induction heater 14.

First connector 44 includes a lead 50 which extends to a tee 52. Tee 52 has a first end 54 connected to an end cap 56 and a second end 58 connected to an extension 60 of first connector 44. Extension 60 connects tee 52 with a first end 62 of a casing, or hose 64. Hose 64 winds concentrically through body 36 of induction heater 14 to a second end 66. An extension 68 connects second end 66 hose 64 with a first end 70 of a tee 72. A second end 74 of tee 72 has an end cap 76 attach thereto. A third end 78 of tee 72 is connected to a lead 80 of second connector 46.

Figure 3:
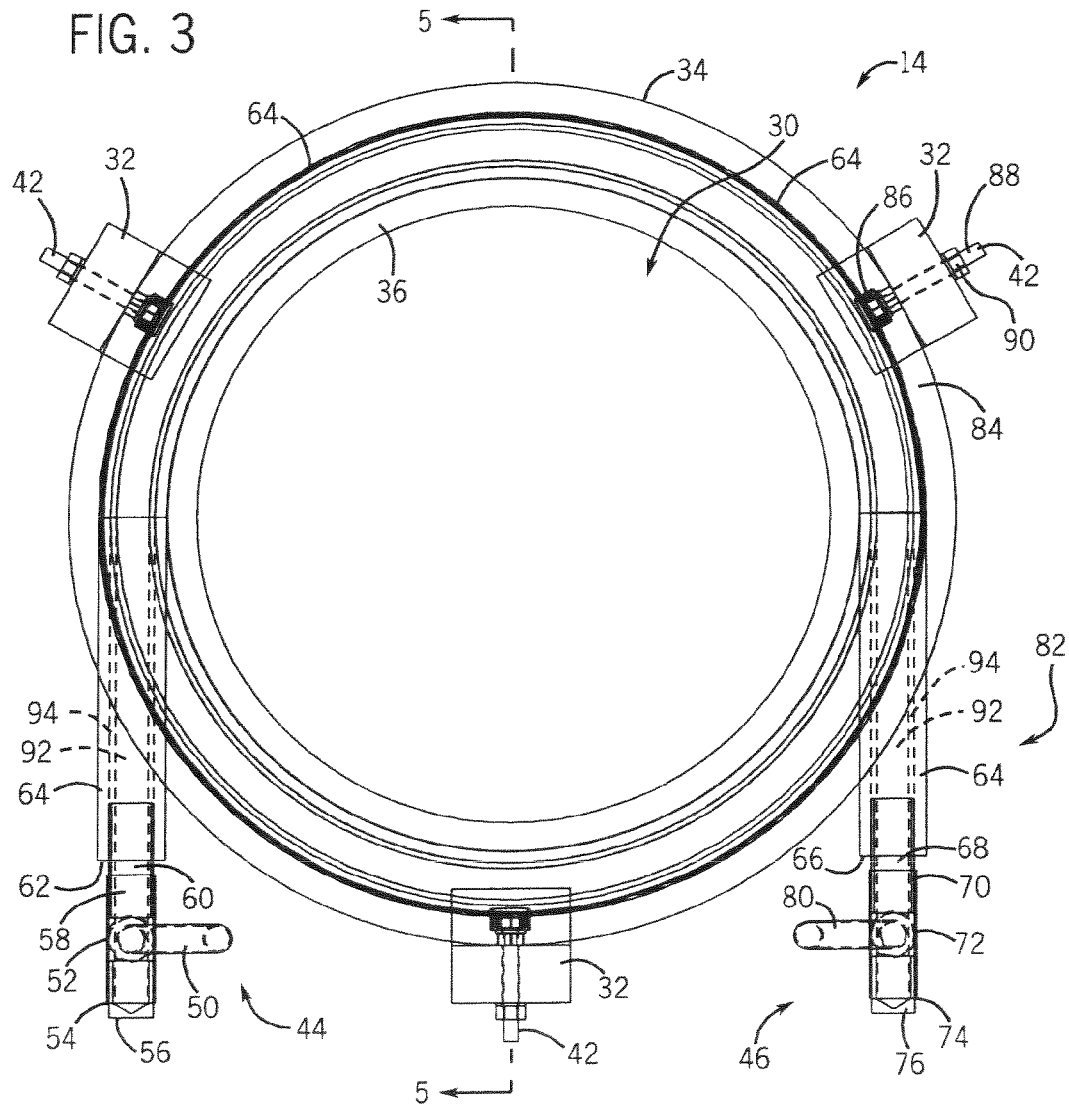
FIG. 3 is an end view of the induction heater of FIG. 2.

As shown in FIG. 3, first connector 44 and second connector 46 exit a common side 82 of body 36 of induction heater 14. Legs 32 are positioned about perimeter 34 of body 36. Cable ties 42 extend through legs 32 and into an outer portion 84 of body 36 of induction heater 14. A first end 86 of each cable tie 42 engages hose 64 of induction heater 14. A second end 88 of each cable tie 42 extends beyond leg 32 and is engaged by a nut 90. Such a construction positions individual windings of hose 60 radially and axially uniformly within body 36 of induction heater 14. A coil 92, having a plurality of individually strands of wire which exhibit Litz characteristics, extends from end cap 56 of first connector 44, passes through hose 64, to end cap 76 of second connector 46. A gap 94 is maintained between coil 92 and hose 64 to allow for the circulation of cooling fluid through the hose. Coil 92 is electrically connected to both first connector 44 and second connector 46 to complete an electrical circuit through induction heater 14.

Figure 4:
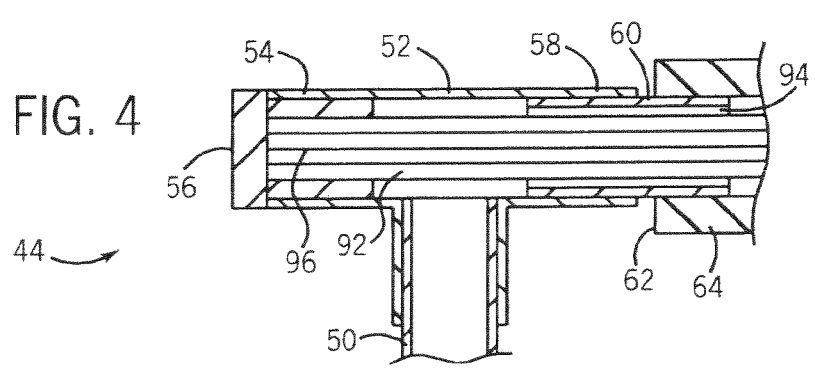
FIG. 4 is a cross-sectional view of a lead of the induction heater of FIG. 2.

As shown in FIG. 4, coil 92 extends through hose 64, extension 60, tee 52, and into end cap 56. A first end 96 of coil 92 is soldered into end cap 56. End cap 56 is soldered into first end 54 of tee 52. Such a construction electrically connects the individual strands of coil 92 to lead 50. Extension 60 connects tee 52 to first end 62 of hose 64. Gap 94 allows a cooling flow circulated through lead 50 to pass over coil 92, through extension 60, and into hose 64. Such a construction allows for electrically connecting coil 92 to a power source (not shown) and for the connection of induction heater 14 to a fluid coolant source (not shown). Second connector 46, shown in FIG. 3, is constructed similar to first connector 44, as shown in FIG. 4. As such, a cooling loop is completed between first connector 44 and second connector 46. Such a construction allows coil 92 to be fluidly cool during operation.

Figure 5:
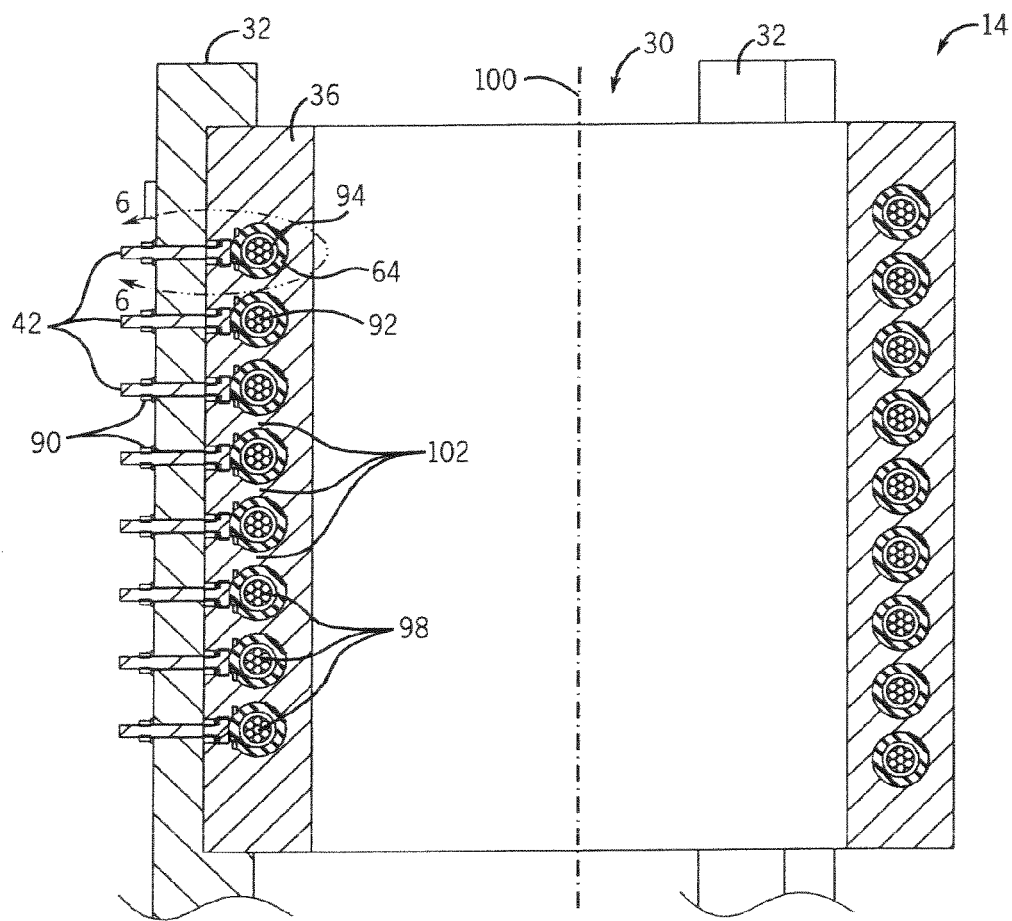
FIG. 5 is a cross-sectional view of the induction heater of FIG. 2.

As shown in FIG. 5, coil 92 has a plurality of individual windings 98 equally spaced from an axis 100 of induction heater 14. Cable ties 42 maintain a uniform gap 102 between adjacent windings 98 and space windings 98 equidistantly from axis 100. The uniform positioning of windings 98 of induction heater 14 ensures uniform heating of a material placed in opening 30.

Figure 6:
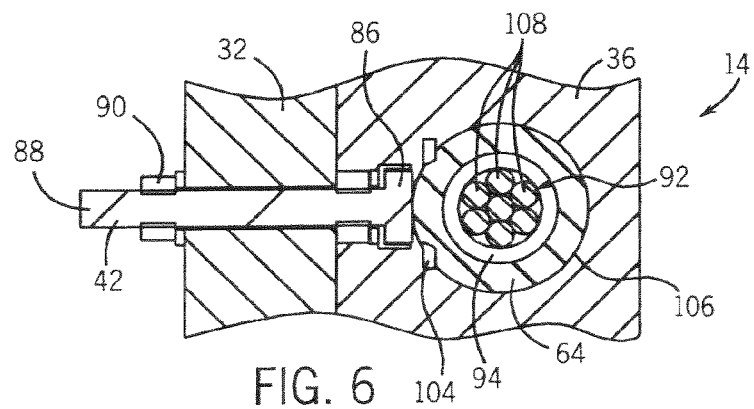
FIG. 6 is a cross-sectional view of a single winding of a coil of the induction heater of FIG. 2.

FIG. 6 shows the arrangement of a single cable tie 42 to induction heater 14. A clip 104 extends from first end 86 of cable tie 42 and engages in outer diameter 106 of hose 64. Second end 88 of cable tie 42 receives a nut 90 there-about and secures leg 32 to body 36 of induction heater 14. In hose 64, gap 94 surrounds a plurality of strands of wire 108 which form coil 92. Each respective strand of wire is electrically insulated from adjacent strands and has Litz characteristics when energized, such as low electrical skin losses. One skilled in the art will recognize that Litz characteristics include low losses at high frequencies and, as a result of the relative size of each strands of wire, power losses are less when compared to conventional or non-Litz configurations.

When compared to a conventional induction heater having a tube coil, the induction heater of the present invention operates approximately 62% more efficiently. That is, only approximately 20% of the total electrical energy applied to an induction heater having a tubular copper coil is used to induce current in the base material whereas an induction heater according to the present invention utilizes approximately 82% of the total electrical energy applied to the coil to induce current in the base material. As such, utilizing a crystal grower according to the present invention, being approximately 62% electrically more efficient that known crystal growers, can result in significant cost savings during operation of the crystal grower. In other words, a 50 kW input with the present invention results in approximately 6 kW of less as compared to 40 kW of less typically associated with a 50 kW input to a conventional induction heater. Additionally, by maintaining gap 94 between coil 92 and hose 64 allows at least a portion of each wire 108 to be cooled by a flow of cooling fluid circulated through hose 64 thereby prolonging the operational life of the induction heater.

In a first embodiment of the present invention, a crystal growing apparatus has a receptacle and an induction heater. The receptacle is constructed to receive a material selected to grow a crystal and the induction heater has a Litz coil and is constructed to heat the material.

According to another embodiment of the present invention, an induction heater has a casing having a first end and a second end. The casing has a coil of woven strands of wire having a first end and a second end passing therethrough. A lead is connected to an end of the coil of woven strands of wire and has a passage therethrough.

In accordance with a further embodiment of the present invention, a method of manufacturing a crystal grower includes providing a reservoir to receive a crystal growing material therein and coiling a Litz coil about the reservoir.

According to yet another embodiment of the present invention, a method of growing a crystal includes the steps of placing a crystal growing material in a vessel and energizing a coil of wire wound about the vessel that has Litz characteristics such that increased heating efficiency is achieved.

The present invention has been described in terms of the preferred embodiment, and it is recognized that equivalents, alternatives, and modifications, aside from those expressly stated, are possible and within the scope of the appending claims.

What is claimed is:

1. A crystal growing apparatus comprising:
   a receptacle constructed to receive a material selected to grow a crystal;
   an induction heater having a Litz coil and constructed to heat the material; and
   a housing positioned about the induction heater and constructed to receive the receptacle therein.

2. The crystal growing apparatus of claim 1 further comprising a water passage extending through the induction heater and constructed to allow a water flow therethrough to cool the Litz coil.

3. The crystal growing apparatus of claim 1 further comprising a controller electrically connected to a pair of ends of the Litz coil and constructed to pass an electrical signal therethrough.

4. The crystal growing apparatus of claim 1 further comprising a rod constructed to initiate a pull of a crystal from the material.

5. The crystal growing apparatus of claim 1 wherein the induction heater further comprises a hose constructed to receive the Litz coil therein.

6. The crystal growing apparatus of claim 5 wherein the housing is positioned about the hose and further comprises at least one leg constructed to be attached to the hose, the leg having an end which extends past an end of the housing.

7. The crystal growing apparatus of claim 6 further comprising at least one cable tie mount passing through the at least one leg and connected to the hose.

8. The crystal growing apparatus of claim 1 wherein the reservoir is constructed of a material that is responsive to induction heating.

9. An induction heater comprising:
   a casing having a first end and a second end;
   a coil of woven strands of wire having a first end and a second end and passing through the casing;
   a lead connected to an end of the coil of woven strands of wire and having a passage therethrough, the passage constructed to provide coolant to a space between the coil of woven strands of wire and the casing; and
   at least one support leg extending along a coiled portion of the casing and constructed to retain the casing in a coiled position.

10. The induction heater of claim 9 wherein the individual wires of the coil of woven strands of wire are electrically isolated from one another along a length of the individual wires.

11. The induction heater of claim 9 wherein the coil of woven strands of wire is a Litz coil.

12. The induction heater of claim 9 further comprising at least one cable tie passing through the support leg and engaged with at least a portion of the casing wherein the at least one cable tie maintains a spacing between an adjacent winding of the coil of woven strands of wire.

13. The induction heater of claim 9 further comprising a housing having an opening therethrough and extending about the casing and a portion of the at least one support leg.

14. The induction heater of claim 13 further comprising a fitting constructed to secure an end of the casing to the housing.

15. The induction heater of claim 9 further comprising a first and a second connector, each connector constructed to electrically connect a respective end of the coil of woven strands of wire to a power source.

16. The induction heater of claim 9 incorporated into a crystal growing device and constructed to heat a crystal growing material.

17. A method of manufacturing a crystal grower comprising:
   providing a reservoir to receive a crystal growing material therein; and
   coiling a Litz coil to receive the reservoir within a coiled portion of the Litz coil; and
   attaching at least one leg to the coiled portion of the Litz coil to maintain a coiled orientation of the coiled portion of the Litz coil.

18. The method of claim 17 further comprising energizing the coil of wire to heat the crystal growing material in the reservoir.

19. The method of claim 17 wherein providing a reservoir includes forming a reservoir of a material resistant to induction heating.

20. The method of claim 17 further comprising preventing atmospheric contamination of the crystal growing material by enclosing the reservoir.

21. A method of growing a crystal comprising the steps of:
placing a crystal growing material in a vessel; and
energizing a coil of wire that has Litz characteristics and that is wound about the vessel and held in a coiled position by a housing formed thereabout.

22. The method of claim 21 further comprising circulating coolant about the coil of wire to cool the coil of wire.

23. The method of claim 21 further comprising pulling a crystal fiber from the crystal growing material in the vessel.

24. The method of claim 21 further comprising achieving a heating efficiency of at least 75%.

25. The method of claim 21 wherein the step of energizing includes no more than a 25% energy loss by the coil of wire.

26. The method of claim 25 wherein the step of energizing includes no more than an 18% energy loss by the coil of wire.

27. The method of claim 21 wherein the step of energizing results in induction heating of the vessel.

28. The method of claim 21 wherein the step of energizing results in induction heating of the crystal growing material.

* * * * *